(12) United States Patent
Shim et al.

(10) Patent No.: US 7,786,510 B2
(45) Date of Patent: Aug. 31, 2010

(54) TRANSISTOR STRUCTURE AND MANUFACTURING METHOD THEREOF

(75) Inventors: Kyu-Hwan Shim, Jeollabuk-do (KR); Sang-Sig Choi, Jeollabuk-do (KR); A-Ram Choi, Jeollabuk-do (KR)

(73) Assignee: Chonbuk National University, Jeonbuk (KR)

( * ) Notice: Subject to any disclaimer, the term of this patent is extended or adjusted under 35 U.S.C. 154(b) by 434 days.

(21) Appl. No.: 11/707,527

(22) Filed: Feb. 16, 2007

(65) Prior Publication Data
US 2008/0116488 A1    May 22, 2008

(30) Foreign Application Priority Data
Nov. 20, 2006  (KR) .................. 10-2006-0114454

(51) Int. Cl.
*H01L 31/0328*  (2006.01)

(52) U.S. Cl. ...................................... 257/197; 257/592
(58) Field of Classification Search ................. 257/197, 257/198, 592, 628
See application file for complete search history.

(56) References Cited

U.S. PATENT DOCUMENTS 7,102,205 B2 *  9/2006  Chidambarrao et al. ..... 257/592
7,521,772 B2 *  4/2009  Adam et al. ................. 257/517

* cited by examiner

*Primary Examiner*—Mark Prenty
(74) *Attorney, Agent, or Firm*—Patents+TMS, P.C.

(57) ABSTRACT

An HBT structure and manufacturing method thereof, in which the HBT structure includes an emitter, an intrinsic base, a collector, an insulating sidewall, and a stress-inducing base formed by selective epitaxial growth to locally induce a stress to the HBT structure. Compressive or tensile stress is additionally induced from outside to modify physical and electric properties of a semiconductor layer, thereby improving the performance of the transistor.

4 Claims, 16 Drawing Sheets

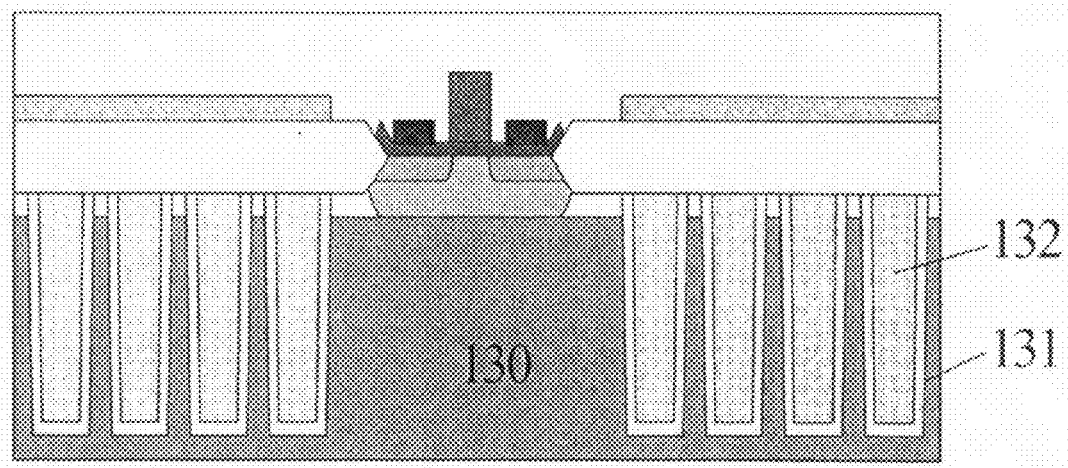
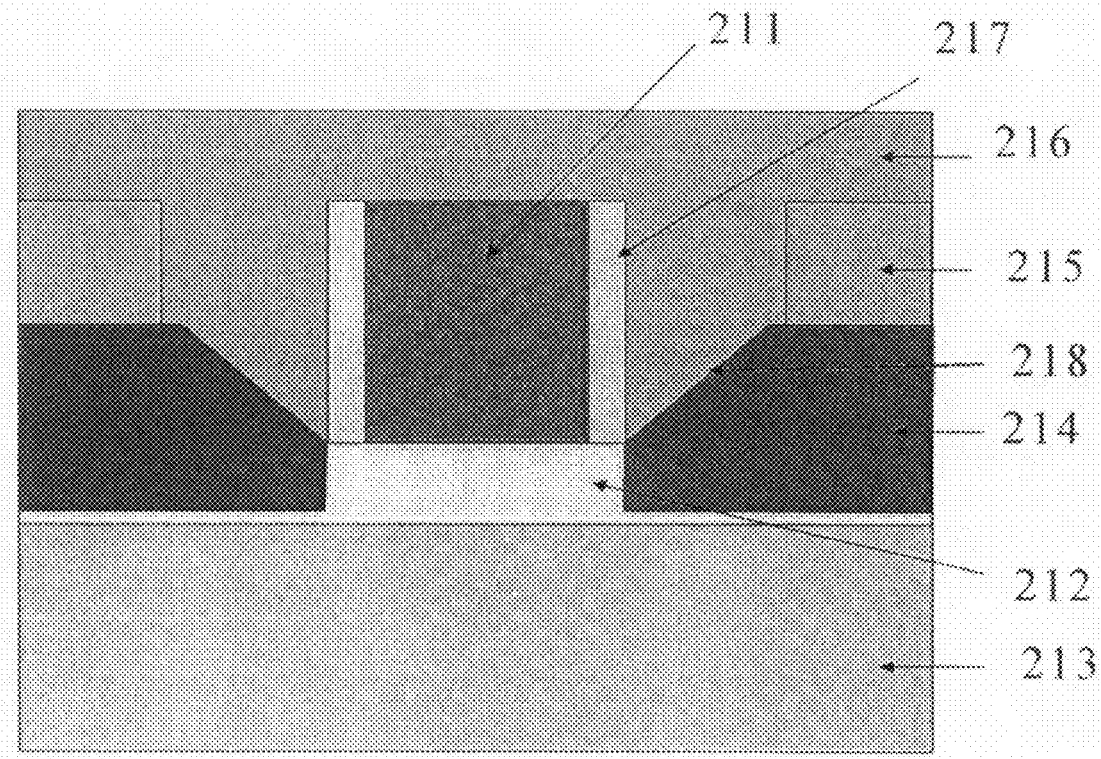

← 417

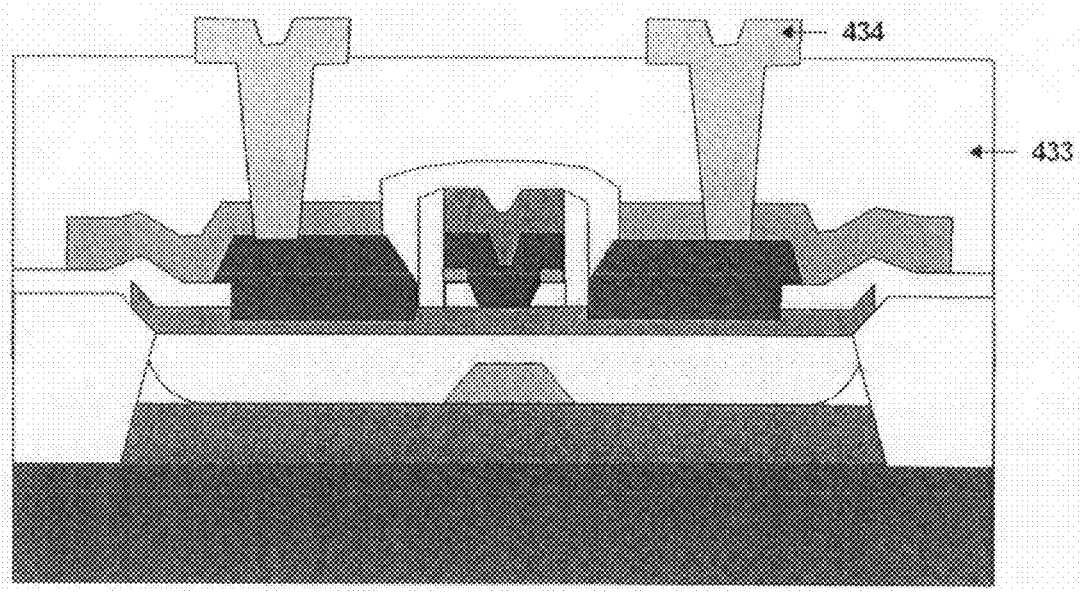

TRANSISTOR STRUCTURE AND MANUFACTURING METHOD THEREOF

CLAIM OF PRIORITY

This application claims the benefit of Korean Patent Application No. 2006-114454 filed on 20, Nov. 2006, in the Korean Intellectual Property Office, the disclosure of which is incorporated herein by reference.

CROSS REFERENCE TO THE RELATED ART

[1] "Bipolar Transistor Structure with Self-Aligned Raised Extrinsic Base and Methods," T. N. Adam, K. K. Chan, M. H. Khater, B. A. Rainey, K. T. Schonenberg, US2005/0151225 A1, published Jul. 14, 2005

[2] "Hetyero Bipolar Transistor," T. Saitoh, S. Aoki, K. Nozawa, T. Ohnishi, US2004/0256635 A1, published Dec. 23, 2004

[3] "Heterojunction Bipolar Transistor and Method for Production Thereof," I. Suzumaru, K. Oda, K. Washio, US2003/0098465 A1, published May 29, 2003

[4] "Bipolar Transistor with Extrinsic Stress Layer," D. Chidambarrao, G. G. Freeman, M. H. Khater, US2006/0043529 A1, published Mar. 2, 2006

[5] "The Effects of Geometrical Scaling on the Frequency Response and Noise Performance of SiGe HBTs," S. Zhang, G. Niu, J. D. Cressler, A. J. Joseph, G. Freeman, D. Harame, IEEE Trans. on Electron Devices, Vol. 49, No. 3, March 2002, pp. 429-435.

[6] "Ultra-Low-Power and High-Speed SiGe Base Bipolar Transistor for Wireless Telecommunication Systems," M. Kondo, K. Oda, E. Ohue, H. Shimamoto, M. Tanabe, T. Onai, K. Washio, IEEE Trans. on Electron Devices, Vol. 45, No. 6, July 1998, pp. 1287-1294.

[7] "Silicon Germanium Heterobipolar Transistor for High Speed Operation," E. Kasper, A. Gruhle, High speed semiconductor devices and circuits, Proceedings, August 1993, IEEE, 2-4, pp. 23-30.

[8] "Mechanical Planar Biaxial Strain Effects in Si/SiGe HBT BiCMOS Technology," M. B. Nayeem, B. M. Hauerud, J. D. Cressler, A. J. Joseph, IEEE, 2004 Tropical Meetings on Silicon Monolithic Integrated Circuits in RF Systems, pp. 103-106

BACKGROUND OF THE INVENTION

1. Field of the Invention

The present invention relates to a semiconductor device having a Heterojunction Bipolar Transistor (HBT) structure and, more particularly, to a transistor structure and manufacturing method thereof, in which compressive or tensile stress is additionally induced from outside to modify physical and electric properties of a semiconductor layer, thereby improving the performance of the transistor.

2. Description of the Related Art

The possibility of a SiGe HBT was proposed in 1957, but owing to insufficient understanding to physical properties of semiconductor and poor technologies about HBT epitaxial growth and manufacturing process, a long time has been spent to develop HBTs and enable their use. Accordingly, SiGe low temperature growth applicable to a transistor was published in 1981, and operating SiGe HBT was published in 1987 by Meyerson of IBM, who developed Ultra High Vacuum Chemical Vapor Deposition (UHVCVD). In 1990, several researchers achieved $f_t$ to exceed 75 GHz. In 1995, Daimler-Chrysler published high frequency characteristics of $f_t/f_{max}$=130/160 GHz, which present applicability to millimeter waves. During these processes, various technologies for SiGe epitaxial growth have been studied, which include UHVCVD, Molecular Beam Epitaxy (MBE), Reduced Pressure Chemical Vapor Deposition (RPCVD), Low Pressure Chemical Vapor Deposition (LPCVD) and the like. Thanks to these researches, it is started to develop SiGe Bipolar Complementary Metal-Oxide Semiconductor (BiCMOS) in 1992. In 2004, very high $f_t$ of 375 GHz was published. In practice, SiGe ICs have been fully commercialized since 1998 as Low Noise Amplifier (LNA), mixer, power amplifier, Voltage Controller Oscillator (VCO) and the like were launched by IBM, Temic, Maxim, SGS Thomson and so on.

However, there are many rooms to improve epitaxy technologies and transistor structures. That is, it is required to decrease current leak and raise reliability in VLSICs. In particular, advanced technologies commonly usable with CMOS process technologies are required to be developed to reduce process steps. In addition, as entering nano-scale as in CMOS technologies, research and development for process and design are consecutively required to produce transistors having a more minute structure.

HBT having merits of a heterojunction structure generally enhances the mobility of carriers to improve high speed operation characteristics and reduces non-linear components caused by single channel to improve characteristics. A conventional SiGe HBT structure has some problems that have to be improved such as large leakage current between a base and a collector and large capacitance of junction, which restricts maximum allowable frequency. These problems act as obstacles against the commercialization of SiGe-HBT, which has been researched by a number of researchers for many years.

Conventionally, in order to raise the speed of a bipolar transistor, a base and a collector have been reduced in their thickness. In addition, to enhance gains, the concentration of impurities implanted into the emitter and the base was controlled or an emitter-base junction of a heterojunction structure has been generally used. However, the thickness of the base cannot be reduced limitlessly and the adjustment of doping concentration or the controlling of a heterojunction structure is also restricted owing to material properties.

FIGS. 1a to 1c are cross-sectional views illustrating conventional transistors, in which FIG. 1a shows a bipolar transistor, FIG. 1b shows a simple structure of HBT, and FIG. 1c shows a transistor with a trench used between a substrate electrode and a metal line of the transistor to decrease capacitance. Here, bases 111 and 112 are formed on a substrate 113 via ion implantation, by using an insulating layer 113.

A Bipolar Junction Transistor (BJT) shown in FIG. 1a, based on only a common bulk substrate, is generally used for low speed analog circuits. At transistor $f_t$ of about 50 GHz, the BJT is being replaced by a Heterojunction Bipolar Transistor (HBT) shown in FIG. 1b. This is primarily because the HBT has an epitaxial base 122 replacing a base layer of the BJT obtained by ion implantation. In the HBT, high gain is obtained by a large offset of a balance band in an interface of base-emitter 122, which obstructs positive hole implantation, and an offset in a conduction band is small to reduce turn-on voltage, thereby decreasing power consumption. In addition, the base having a thickness of 5 to 10 nm, doped with a high concentration, decreases the alteration of the base to enhance linearity characteristics and raise $f_t$, but maximize $f_{max}$ by reducing base resistance.

In the conventional bipolar transistors, performance has been enhanced by reducing the transistor size or by adopting the HBT that uses a heterojunction structure.

However, the operation is still determined by the physical properties of materials constituting the base and the collector, and thus there are needs for another method and transistor structure change that can further enhance performance.

Of the cross reference to the related art, [1] (hereinafter only the document number will be described) discloses a SiGe HBT structure of IBM, in which isolation is enabled by Shallow Trench Isolation (STI) and Deep Trench Isolation (DTI). A triangular SiGe inner base is epitaxially grown, an oxide layer is formed by high pressure oxidation (HIPOX), and then an outer base is deposited. Then, the outer base and the oxide layer are etched in regions around the emitter, a nitride film sidewall is formed, and then an emitter is formed by self-alignment. This transistor structure has merits of simple heat treatment, low stress level and correct control of an emitter cap.

[2] discloses a SiGe HBT structure of Matzushida, in which STI and DTI are applied, an inner base is grown by Ultra High Vacuum Selective Epitaxial Growth (UHV SEG), an outer base is formed, and after etching, an emitter is produced through self-alignment by using an insulating sidewall. The SiGe base is composed of SiGe-cap, graded-SiGe and SiGe-spacer layers, in which the graded-SiGe layer is formed of a number of very thin SiGe layers, which are layered repeatedly. The base structure like this is optimized to increase Fmax.

[3] discloses a SiGe HBT structure of Hitachi, in which a p-SiGeC/n-SiGe structure is applied to an emitter-base junction to enhance electron implantation efficiency in an emitter. An outer base is etched, an inner base is formed by selective growth using an oxide layer sidewall, and the emitter is produced by self-alignment. The SiGe layer of the base is represented in a quadrangular and diamond structure, and the content and topology of C in the front side is optimized to enhance electron implantation efficiency.

[4] is a patent of IBM, proposing a transistor structure, which can enhance transistor performance by controlling the mobility of electrons based on the stress of an outer base in manufacturing of a SiGe HBT. This is difficult to manufacture because of a complicated transistor structure, and an outer base for inducing stress is grown across a wafer. Since thickness to be used is restricted, it is difficult to efficiently control stress.

[5] discloses a representative SiGe HBT structure of IBM, in which isolation is made by STI and DTI, and a triangular SiGe base is used. Low noise characteristics are improved by using a poly-Si emitter of $0.5 \times 20 \times 6^2$, doped with As.

[6] discloses a SiGe HBT structure of Hitachi, in which trench isolation is performed, an inner insulating layer sidewall is used to produce an emitter, an inner base is selectively grown to join with the outer base, and then the emitter is self-aligned. Base-collector capacitance was set 1 fF for the purpose of ultra low voltage and high speed operation. This structure operates with a frequency of 30 to 70 GHz at 100.

[7] discloses a representative transistor structure of Daimler-Benz. A SiGe HBT is developed by MBE for high frequency operation of a Si bipolar transistor, which can operate with a frequency up to 100 GHz. A base, an emitter and a collector are discriminatively produced by mesa etching, in which the base structure is controlled to be quadrangular, inner surface resistance of the base is controlled to be 0.7-3 kohm/sqr.

[8] is a report from IBM, representing results about characteristics change in a case where SiGe BiCMOS is manufactured using a strained epitaxial layer, which is used in MOS. HBT performance degradation caused by tensile stress used in FET is analyzed.

Compared to the conventional technologies, the present invention proposes a high performance HBT, and more particularly, an advanced transistor structure and a manufacturing method thereof, in which compressive or tensile stress is additionally induced from outside to alter physical and electric properties of a semiconductor layer, thereby enhancing transistor performance. Accordingly, the present invention differs from the conventional approaches [1] to [8] in that stress is locally and additionally used to enhance transistor performance, energy band difference is controlled, and different processes are used to manufacture this transistor structure.

SUMMARY OF THE INVENTION

The present invention has been made to solve the foregoing problems of the prior art and therefore an object of the present invention is to provide a transistor structure and a manufacturing method thereof, in which compressive or tensile stress is additionally induced from outside to modify physical and electric properties of a semiconductor layer, thereby improving the performance of the transistor.

Since the conventional approaches are restricted owing to basic properties of materials, the object of the invention is to provide an advanced transistor structure which compressive or tensile stress is additionally induced from outside to modify electric properties of materials thereby enhancing gains.

According to an aspect of the invention, the HBT structure includes an emitter, an intrinsic base, a collector, an insulating sidewall, and a stress-inducing base formed by selective epitaxial growth to locally induce a stress to the HBT structure.

According to another aspect of the invention, a first embodiment of the method of manufacturing an HBT includes steps of:

growing a collector layer and a base epitaxial layer by Shallow Trench Isolation (STI) and depositing a lower emitter layer and an upper emitter layer to form an emitter structure; and (ii) after the step (i), forming a stress-inducing epitaxial layer and a stress-inducing insulating layer to produce an HBT structure.

According to further another aspect of the invention, a second embodiment of the method of manufacturing an HBT includes steps of:

forming high and low resistance layers on a base collector by Local Oxidization of Silicon (LOCOS), forming a collector layer and forming an emitter layer; and after the step (i), forming a stress-inducing epitaxial layer and a stress-inducing insulating layer to produce an HBT structure.

BRIEF DESCRIPTION OF THE DRAWINGS

The above and other objects, features and other advantages of the present invention will be more clearly understood from the following detailed description taken in conjunction with the accompanying drawings, in which:

FIGS. 1a to 1c are cross-sectional views illustrating conventional transistor structures;

FIG. 2 is a cross-sectional view illustrating transistor structure according to an embodiment of the invention;

DETAILED DESCRIPTION OF THE PREFERRED EMBODIMENT

The present invention will now be described more fully hereinafter with reference to the accompanying drawings, in which preferred embodiments of a transistor structure and a manufacturing method thereof according to the invention are shown.

Figure 1A:
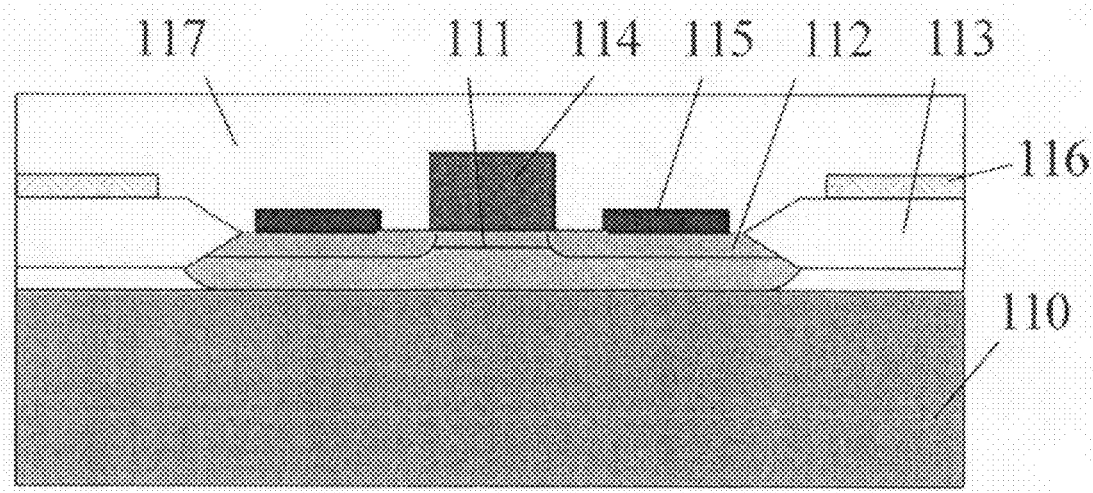
Figure 1B:
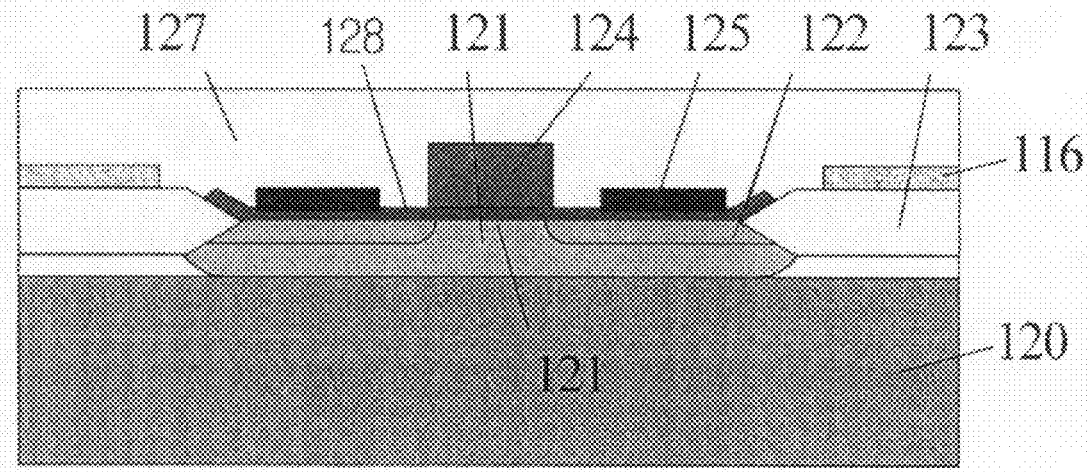
Figure 3:
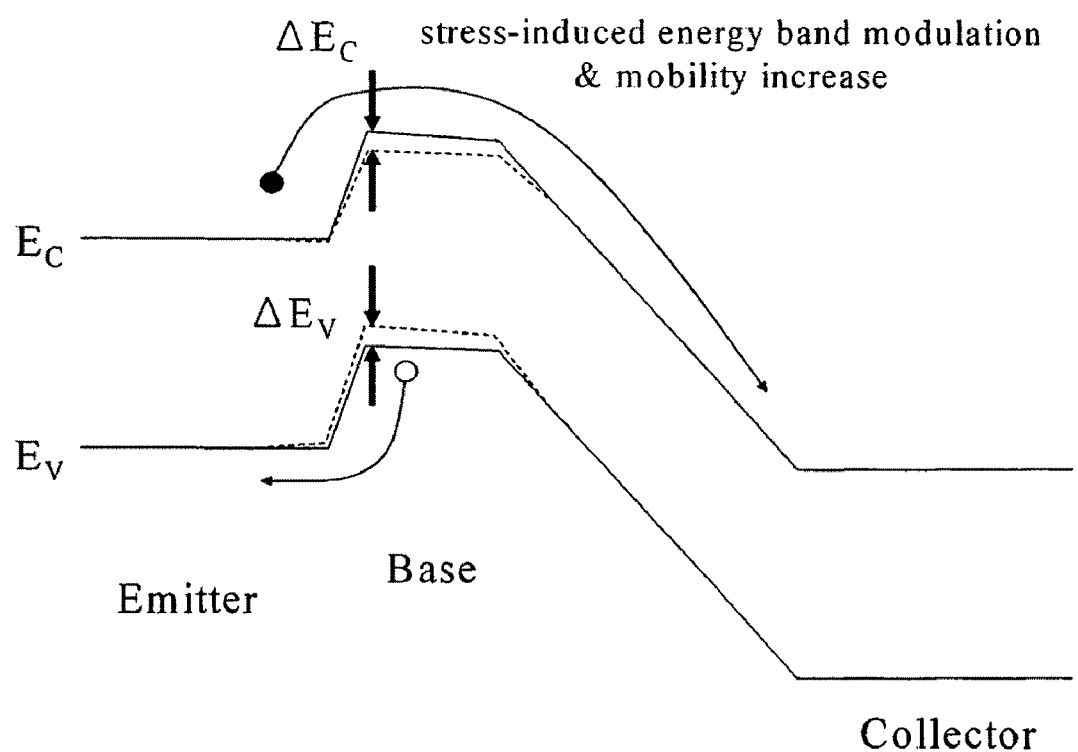
FIG. 3 is a diagram illustrating the structure shown in FIG. 2.

FIG. 2 is a cross-sectional view illustrating a transistor structure according to an embodiment of the invention, and FIG. 3 is a diagram illustrating the structure shown in FIG. 2.

As shown FIGS. 2 and 3, an HBT (or heterojunction bipolar semiconductor device) structure has an emitter 211, an intrinsic base 212, a collector 213, an insulating sidewall 217. The HBT structure further has a base 214 formed Selective Epitaxial Growth (SEG) to locally induce stress to the transistor.

The base 214 for inducing stress is formed particularly through self-alignment epitaxial growth, which has a (311) slope 218.

The transistor structure further has an insulating layer 215 for additionally inducing a local stress to the transistor structure.

The transistor structure collectively applies stress to a local area by using the base 214 obtained by SEG and the insulating layer 215 to alter a band structure in the junction between the emitter 211 and the intrinsic base 212. With the altered band structure, it is possible to control the implantation efficiency of minority carriers to raise gains in voltage, thereby enhancing operation performance.

In the transistor structure, a stress induced through stress collection by the (311) slope 218 helps conduction from the emitter 211 over the intrinsic base 212 to the collector 213.

With the stress-inducing base 214 and the stress-inducing insulating layer 215, the stress acts to control band barriers of a conduction band and a base band existing between the emitter 211 and the intrinsic base 212 to regulate implantation efficiencies of electrons and positive holes so as to enhance gains.

The transistor structure controls the structural shape of the stress-inducing base 214 by the slanted (311) slope 218 so that stress is collectively and locally induced to the transistor, thereby regulating the collectivity of the stress.

The transistor structure also has a low resistance collector (see the reference signs 314 and 413 in FIGS. 5a and 7a) defined between the collector 213 and the intrinsic base 212.

The transistor structure uses a semiconductor substrate made of at least one selected from the group consisting of IV-IV, III-V and II-VI semiconductors, containing Si, GaAs, GaN and InP. For the purpose of inducing stress, the transistor structure has a heterojunction semiconductor epitaxial layer containing at least one selected from the group consisting of SiGe/Si, GaAs/AlGaAs, InP/InGaAs and GaN/AlGaN according to substrate types used.

Figure 4:
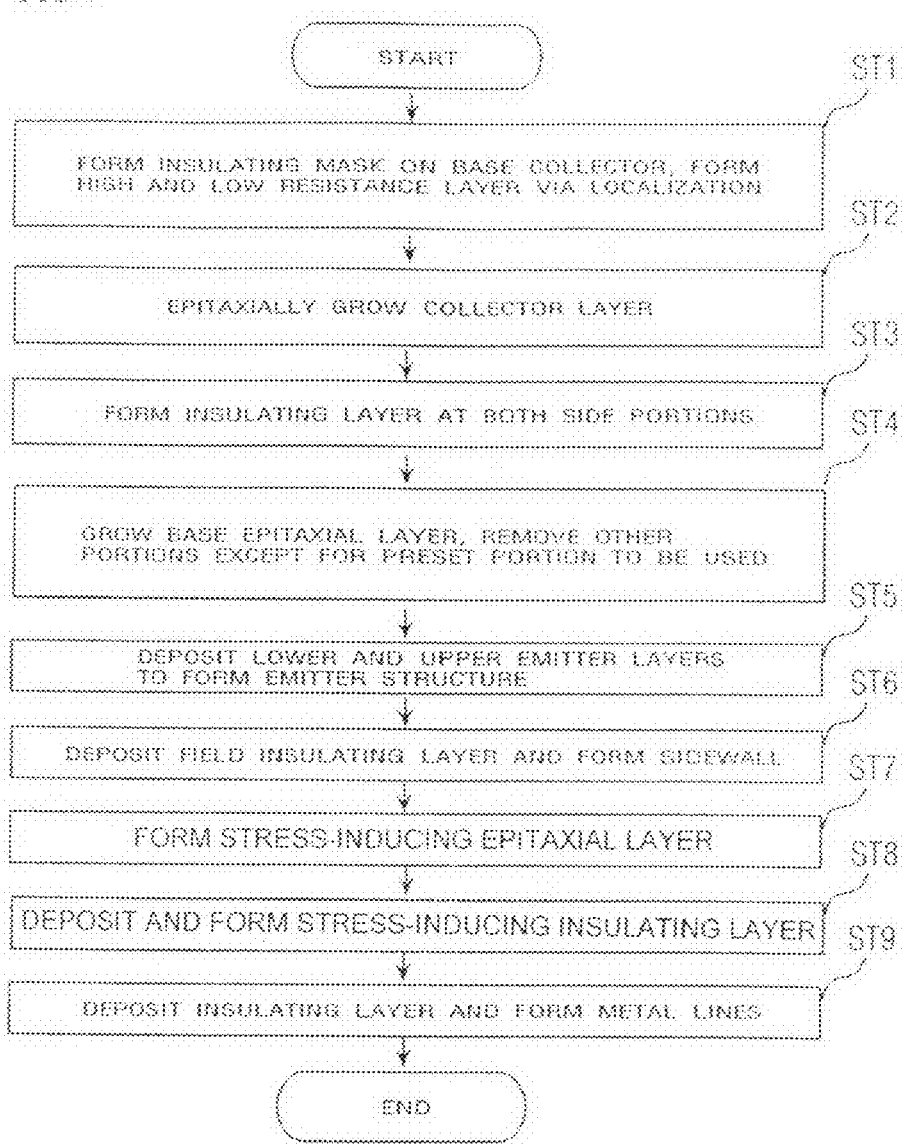
FIG. 4 is a flowchart illustrating a manufacturing method of a transistor structure according to a first embodiment of the invention.

FIG. 4 is a flowchart illustrating a manufacturing method of a transistor structure according to a first embodiment of the invention, and FIGS. 5a to 5i are cross-sectional views illustrating the manufacturing method of a transistor structure shown in FIG. 4.

Referring to FIGS. 4 and 5a to 5i, the manufacturing method includes a first process ST1 to ST6 of growing a collector layer 315 and a base epitaxial layer 317 by Shallow Trench Isolation (STI) and depositing a lower emitter layer 318 and an upper emitter layer 319 to form an emitter structure and a second process ST7 to ST9 of forming a stress-inducing epitaxial layer 322 and a stress-inducing insulating layer 323, after the first process, to produce a transistor structure.

The first process includes following stepwise steps of: forming an insulating mask on the substrate 311 to form a high resistance layer 312 and a low resistance layer 313 via localization, epitaxially growing a collector layer 315, forming an insulating layer 316 on both side portions thereof, growing a base epitaxial layer 317 but removing other portions except for a preset portion to be used, depositing a lower emitter layer 318 and an upper emitter layer 319 to form an emitter structure, and the depositing a field insulating layer 321 and forming a sidewall 320.

The second process includes following procedures of: after the first process, forming an epitaxial layer 322 for inducing stress in ST7, depositing and forming the stress-inducing insulating layer 323 in ST8, and depositing an insulating layer 324 and forming metal lines 325 in ST9.

In ST7, the stress-inducing epitaxial layer 322 is formed by SEG.

The SEG in ST7 uses a precursor of a mixed gas containing Cl gas to enable SEG on the surface of the transistor.

The SEG in ST7 allows the sectional structure of the stress-inducing epitaxial layer 322 to be determined by temperature, mixing conditions of gases and process pressure.

The SEG is carried out to control the geometry of the stress-inducing epitaxial layer 322 to have a slanted (311) slope at inner edges.

In ST7, the stress-inducing epitaxial layer 322 is formed in such a fashion that a crystalline plane in (311) orientation develops from a region in contact with the sidewall to collect stress so that localized stress is induced by SEG.

When the stress-inducing epitaxial layer 322 is formed in such a fashion that a crystalline plane in (311) orientation develops from a region in contact with the sidewall to collect stress so that localized stress is induced by SEG, it is preferable to proceed with SEG while gradually increasing mole fraction difference so that stress is gradually collected.

In ST7, the stress-inducing epitaxially layer 322 is doped with p-type or n-type impurities with a high concentration the same as that of the base.

In addition, stress is transferred from the stress-inducing epitaxial layer 322 to minimize the resistance of the intrinsic base with a low specific resistance.

Furthermore, the stress-inducing epitaxial layer 322 grown by SEG has a small difference in composition ratio at the interface with the intrinsic base to prevent defects, and the composition ratio difference is gradually increased to collect stress by lattice constant mismatch.

A Si-oxide or Si-nitride layer is used for the stress-inducing insulating layer 323 in the procedure ST8 of forming the stress-inducing insulating layer 323.

Figure 6:
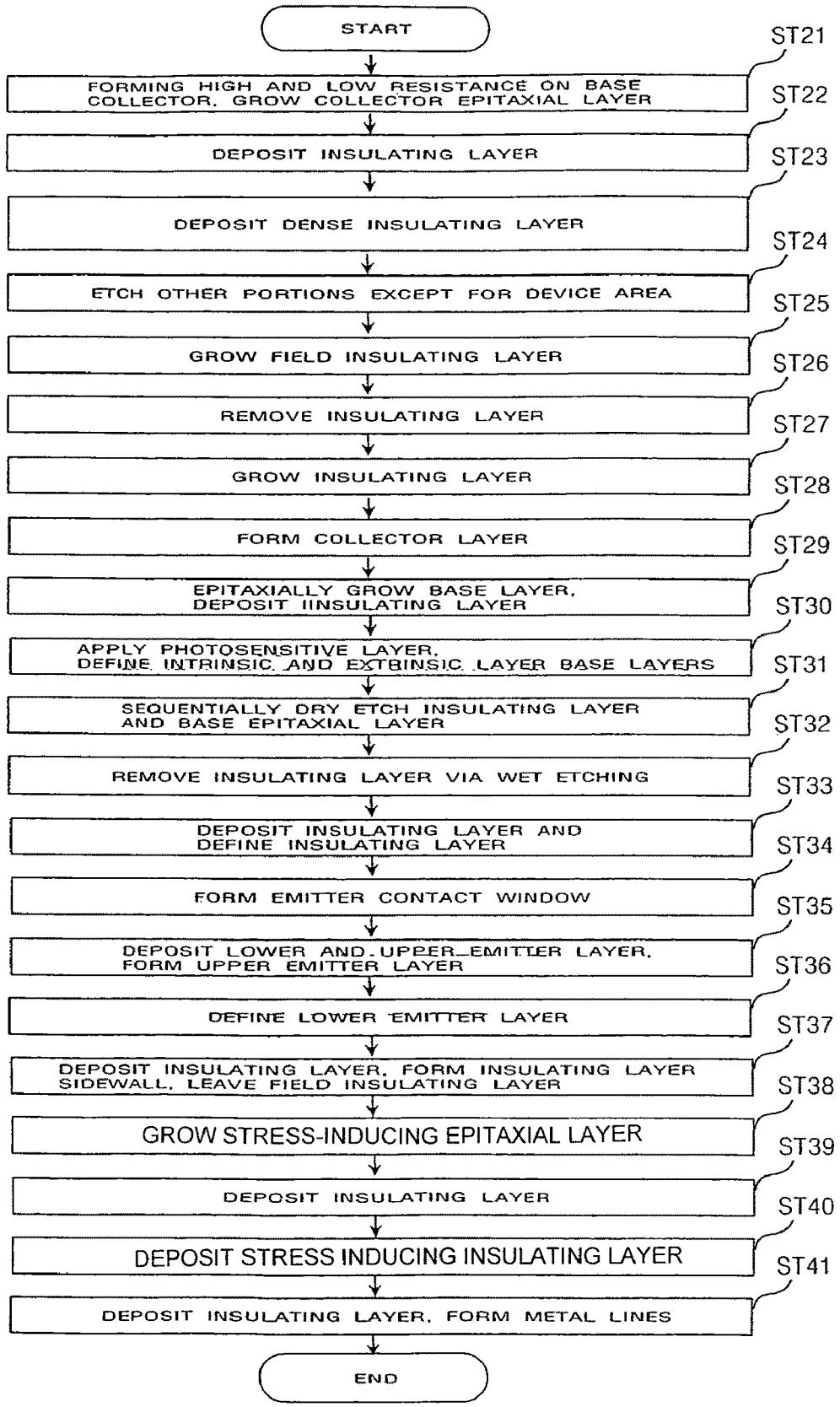
FIG. 6 is a flowchart illustrating a manufacturing method of a transistor structure according to a second embodiment of the invention.
Figure 7A:
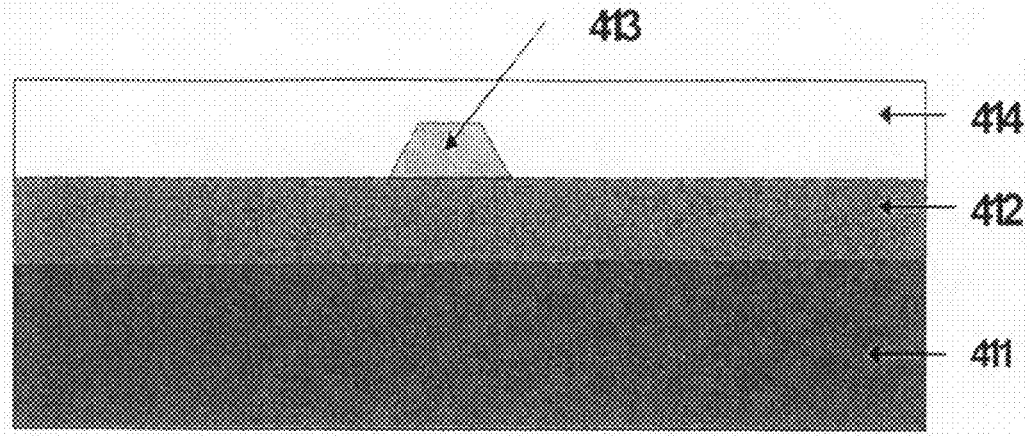
FIGS. 7a to 7u are cross-sectional views illustrating a manufacturing method of a transistor structure shown in FIG. 6.

FIG. 6 is a flowchart illustrating a manufacturing method of a transistor structure according to a second embodiment of the invention, and FIGS. 7a to 7u are cross-sectional views illustrating a manufacturing method of a transistor structure shown in FIG. 6.

Referring to FIGS. 6 and 7a to 7u, the manufacturing method includes a first process ST21 to ST37 of forming high and low resistance layers 412 and 413 sequentially on a base collector via Local Oxidization of Silicon (LOCOS), forming a collector layer and forming an emitter layer; and a second process ST38 to ST41 of forming a stress-inducing epitaxial layer 430 and forming a stress-inducing insulating layer 432, after the first process, to produce a transistor structure.

Particularly, the first process includes stepwise procedures of: forming the high resistance layer 412 and the low resistance layer 413 sequentially on the base collector 411, growing a collector epitaxial layer 414, depositing an insulating layer 415, depositing a dense insulating layer 416, removing other portions except for a device area via etching, growing a field insulating layer 417, removing the filed insulating layer 417, growing an insulating film 418, forming a collector ion implantation layer 419, epitaxially growing a base epitaxial layer 420, depositing an insulating layer 421, applying a photosensitive layer 422, defining intrinsic and extrinsic base layers, dry-etching the insulating layer 421 and the base epitaxial layer 420 in the order, removing the insulating layer 421 via wet etching, depositing an insulating layer 423 and a dense insulating layer 424, forming an emitter contact window 425, depositing a lower emitter layer 426 and an upper emitter layer 427, forming the upper emitter layer 427, defining the lower emitter layer 426, depositing an insulating layer, and forming an insulating layer sidewall 428 and leaving a field insulating layer 429 from the insulating layer 423.

The second process includes stepwise procedures of: after the first process, forming a stress-inducing epitaxial layer 430 in ST38, forming an insulating layer 431 in ST39, depositing a stress-inducing insulating layer 432 in ST40, and depositing an insulating layer 433 and forming metal lines 434 in ST41.

In ST38, the stress-inducing epitaxial layer 430 is formed by SEG.

The SEG in ST38 uses a precursor of a mixed gas containing Cl gas to enable SEG on the surface of the transistor.

The SEG in ST38 allows the sectional structure of the stress-inducing epitaxial layer 430 to be determined by temperature, mixing conditions of gases and process pressure.

The SEG is carried out to control the geometry of the stress-inducing epitaxial layer 340 to have a slanted (311) slope.

In ST38, the stress-inducing epitaxial layer 430 is formed in such a fashion that a crystalline plane in (311) orientation develops from a region in contact with the sidewall to collect stress so that localized stress is induced by SEG.

When the stress-inducing epitaxial layer 430 is formed in such a fashion that a crystalline plane in (311) orientation develops from a region in contact with the sidewall to collect stress so that localized stress is induced by SEG, it is preferable to proceed with SEG while gradually increasing mole fraction difference so that stress is gradually collected.

In ST38, the stress-inducing epitaxially layer 430 is doped with p-type or n-type impurities with a high concentration the same as that of the base.

In addition, stress is transferred from the stress-inducing epitaxial layer 430 to minimize the resistance of the intrinsic base with a low specific resistance.

Furthermore, the stress-inducing epitaxial layer 430 grown by SEG has a small difference in composition ratio at the interface with the intrinsic base to prevent defects, and the composition ratio difference is gradually increased to collect stress by lattice constant mismatch.

A Si-oxide or Si-nitride layer is used for the stress-inducing insulating layer 432 in the procedure ST40 of forming the stress-inducing insulating layer 432.

Preferred embodiments of the transistor structure and the manufacturing method thereof according to the invention will now be described in conjunction with the accompanying drawings. In the following description, those elements well known in the art will not be discussed because they may unnecessarily obscure the concept of the invention. Terminologies are defined on account for the functions in the invention, but may be varied in accordance with users, operator's intention or precedent. Accordingly, such terminologies shall be construed in view of the description of the specification.

First, the invention has an aspect of additionally induce compressive stress or tensile stress from outside to modify physical and electric properties of a semiconductor layer, thereby improving the performance of a transistor.

According to the invention, the vertical tensile stress induced to the intrinsic base causes the lattice to be elongated more in a vertical direction than in an equilibrium state so that energy is lowered in a conduction band but raised in a base band. This as a result helps electrons implanted into the emitter migrate over the base to the collector and decreases current owing to the efficiency of positive holes of migrating from the base to the emitter to be implanted as minority carriers. This accordingly shows a state of high electron implantation but low positive hole implantation. That is, unbalanced implantation efficiency of minority carriers is increased to show operation characteristics of high gains. The invention utilizes a principle of modifying the band structure in the emitter-base interface to change the implantation efficiency of minority carriers, thereby enhancing gains.

In addition, the invention provides a transistor structure similar to those of the conventional art but allows stress to be locally collected to the base layer to enhance gains and operation speed. As measures to induce stress, a selectively grown stress-inducing epitaxial layer and a stress-inducing insulating layer are used. The procedure of selectively growing the stress-inducing epitaxial layer on the base layer can be performed simply and thus provides a method of enhancing transistor performance more easily than process technologies of nano-scale which are difficult and expensive. The stress collection utilizes a self-alignment epitaxial growth having a (311) slope. That is, the band structure of the transistor is modified by the stress and the implantation efficiency of minority carriers in the emitter-base heterojunction is controlled according to the modified band structure thereby to enhance current gains.

In a case where electrons are major carriers in the bipolar transistor, the compressive stress is induced in a two dimensional direction to a side of the intrinsic base layer, thereby causing tensile stress in a vertical direction of the emitter-base. The tensile stress induced in the vertical direction, i.e., the migration direction of electrons, changes the energy band structure of conduction and base bands to control implantation efficiency of carriers in the emitter-base junction thereby enhancing gains. As an additional effect, it also decreases the effective mass of electrons to increase conduction speed of electrons moving in a vertical direction, thereby enhancing the operation speed of the transistor. This concept will be described in detail with reference to FIGS. 2 and 3.

Therefore, the transistor structure of the invention can utilize a semiconductor substrate made of various IV-IV, III-V and II-VI semiconductors such as Si, GaAs, GaN and InP, and for the purpose of inducing stress, can use a heterojunction semiconductor epitaxial layer containing at least one selected from the group consisting of SiGe/Si, GaAs/AlGaAs, InP/InGaAs and GaN/AlGaN according to substrate types used.

The stress is controlled by the thickness of the epitaxial layer of the heterojunction semiconductor and the mole fraction of respective atoms.

According to the cross-sectional structure shown in FIG. 2, the stress-inducing epitaxial layer 214 and the stress-inducing insulating layer 215 transfer stresses to the intrinsic base layer 212. Since the stress is induced by the self-aligned SEG layer having a (311) slope as shown, tensile stress is induced vertically to the intrinsic base.

Accordingly, in the energy band structure of the emitter-base-collector as shown in FIG. 3, a modification is induced especially to the band structure of the base part. For example in an NPN type bipolar transistor, such a structural modification of the transistor raises electron implantation efficiency in the emitter-base junction but lowers hole implantation efficiency, to thereby enhance current gains.

In this case, the stress-inducing epitaxial layer 214 is made of a material having a larger lattice constant than that of the base layer. An epitaxial layer having a lattice constant larger for about several percent (%) is grown on the base epitaxial layer so that stress caused by the lattice constant mismatch is transferred to the intrinsic base layer 212. Therefore, the stress-inducing layer is grown not exceeding the critical thickness so as to cause any defects in the interface.

In addition, as shown in FIGS. 2 and 2, vertical tensile stress induced to the intrinsic base causes the lattice to be vertically elongated more than in an equilibrium state so that energy is lowered in a conduction band but raised in a base band. This as a result helps electrons implanted into the emitter migrate over the base to the collector and decreases current owing to the efficiency of positive holes of migrating from the base to the emitter to be implanted as minority carriers. This accordingly shows a state of high electron implantation but low positive hole implantation. That is, unbalanced implantation efficiency of minority carriers is increased to show operation characteristics of high gains. The invention utilizes a principle of modifying the band structure in the emitter-base interface to change the implantation efficiency of minority carriers, thereby enhancing gains.

In addition, band degeneration takes place in the base to decrease effective mass of electrons, i.e., minority carriers migrating in a vertical direction, thereby increasing conduction speed of the electrons. The increased conduction speed shortens a time period that the electrons implanted in the emitter arrive the collector through the base. That is, this increases the operation speed of the electrons. Transistors that induce stress can facilitate processes and thus be more effectively applied as miniaturization processes are performed further. In FIG. 2, the stress-inducing epitaxial layer having a (311) slope is grown by SEG to locally induce stress and a stress-inducing insulator is additionally provided to enhance the collectivity of the stress.

First Embodiment

The first embodiment will be described with reference to FIGS. 4 and 5a to 5i.

Figure 5A:
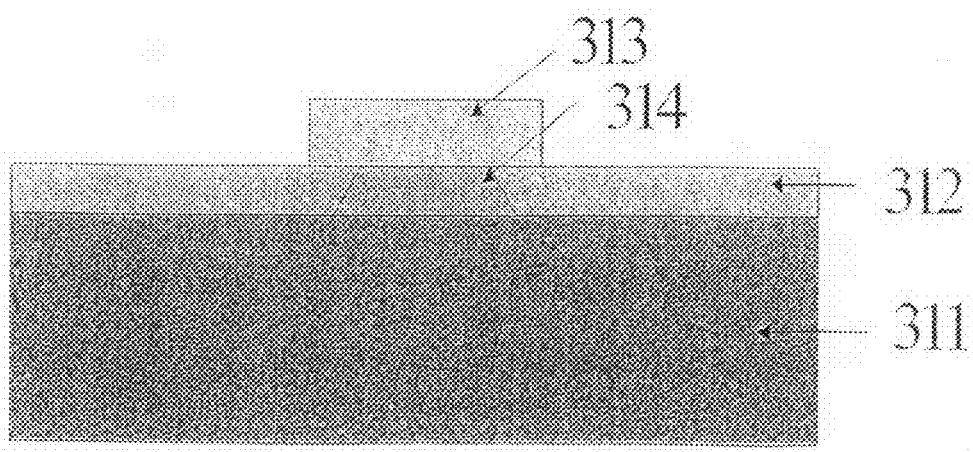
FIGS. 5a to 5i are cross-sectional views illustrating the manufacturing method of a transistor structure shown in FIG. 4.
Figure 5B:
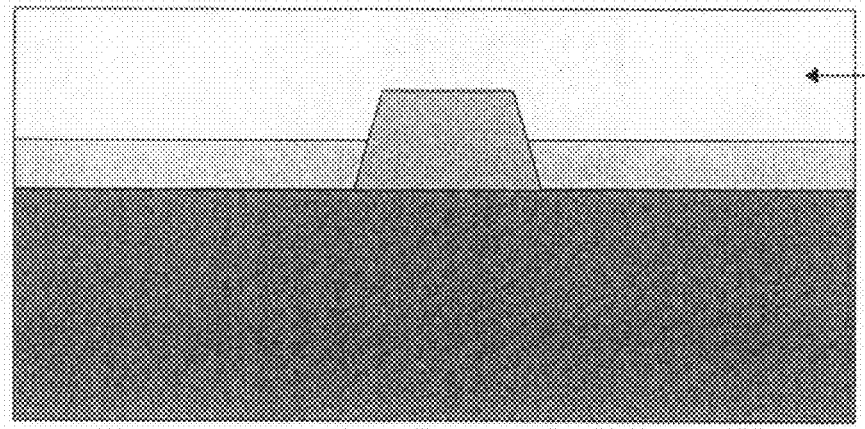
Figure 5C:
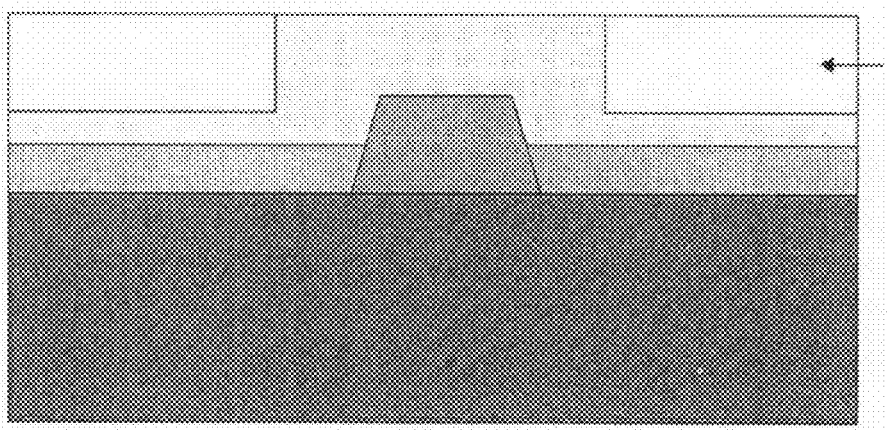
Figure 5D:
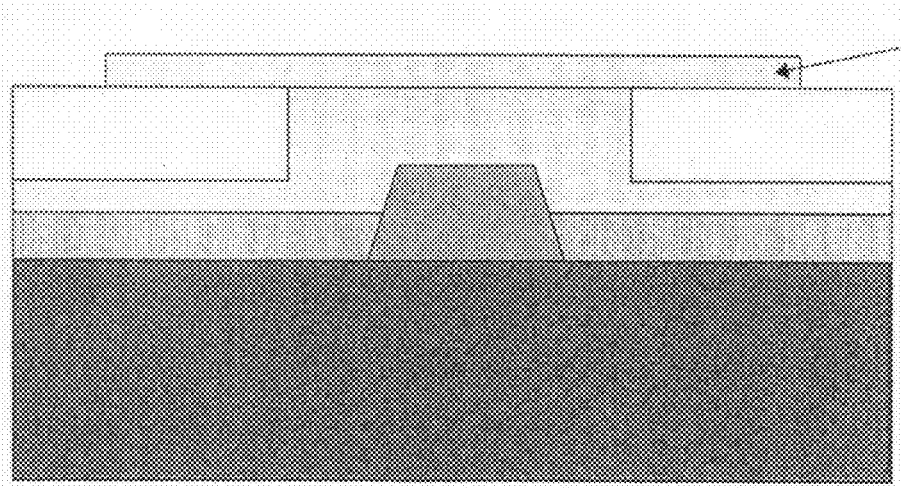
Figure 5E:
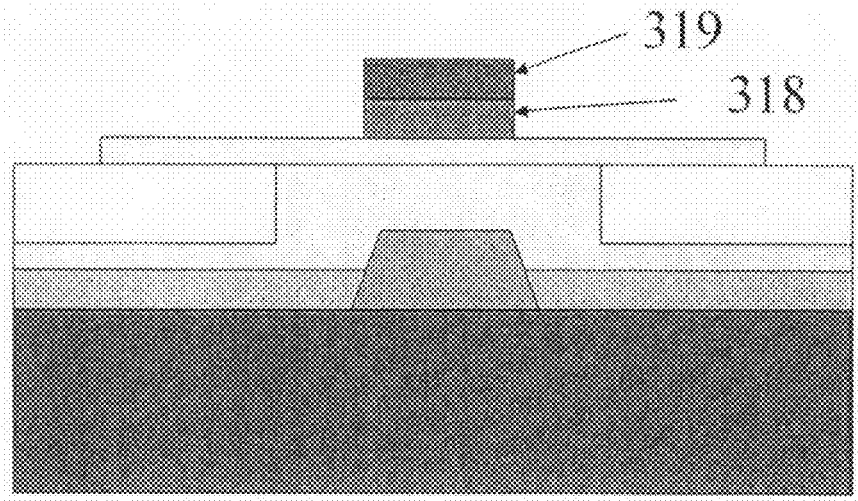
Figure 5F:
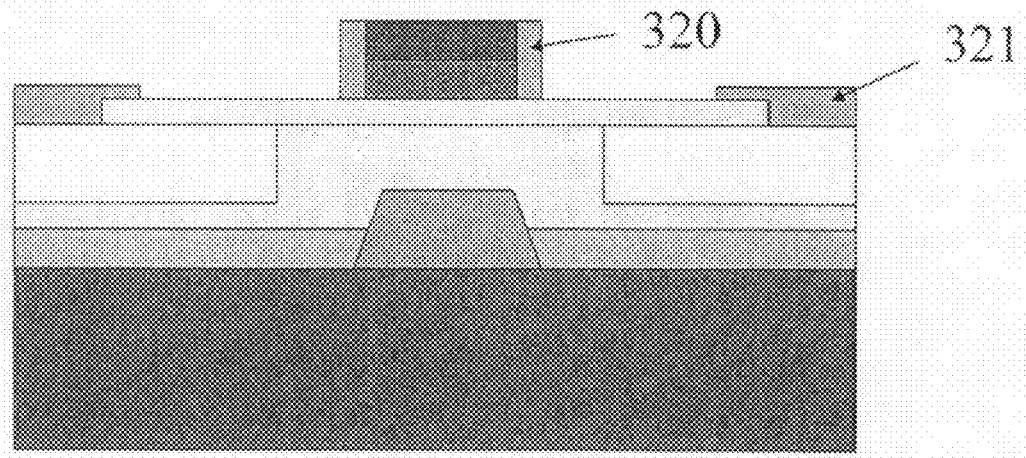
Figure 5G:
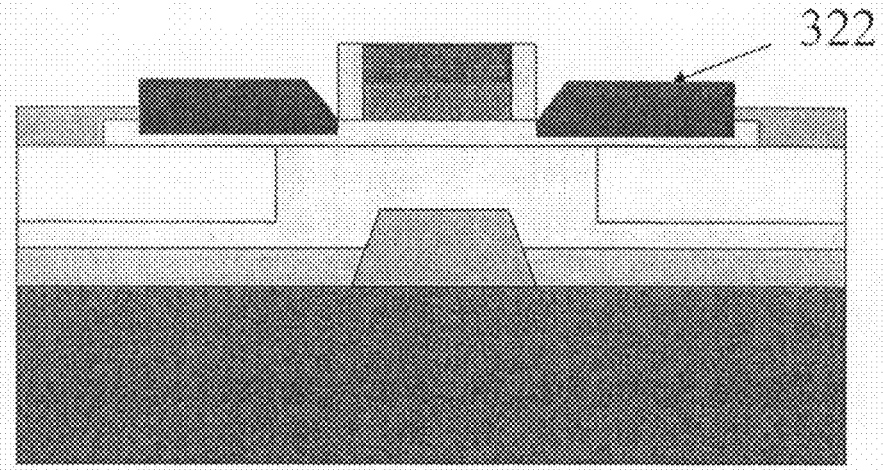
Figure 5H:
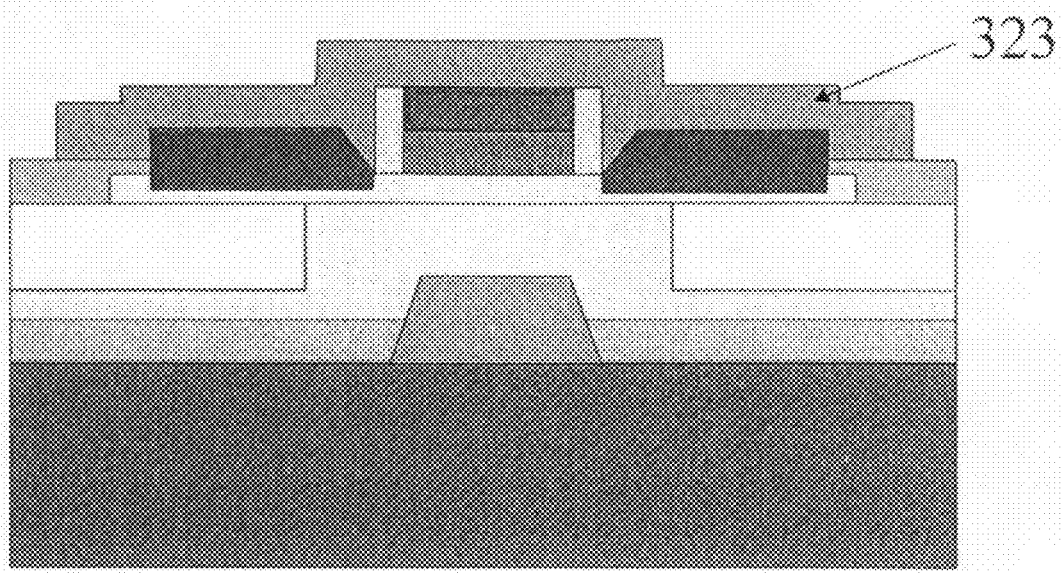
Figure 5I:
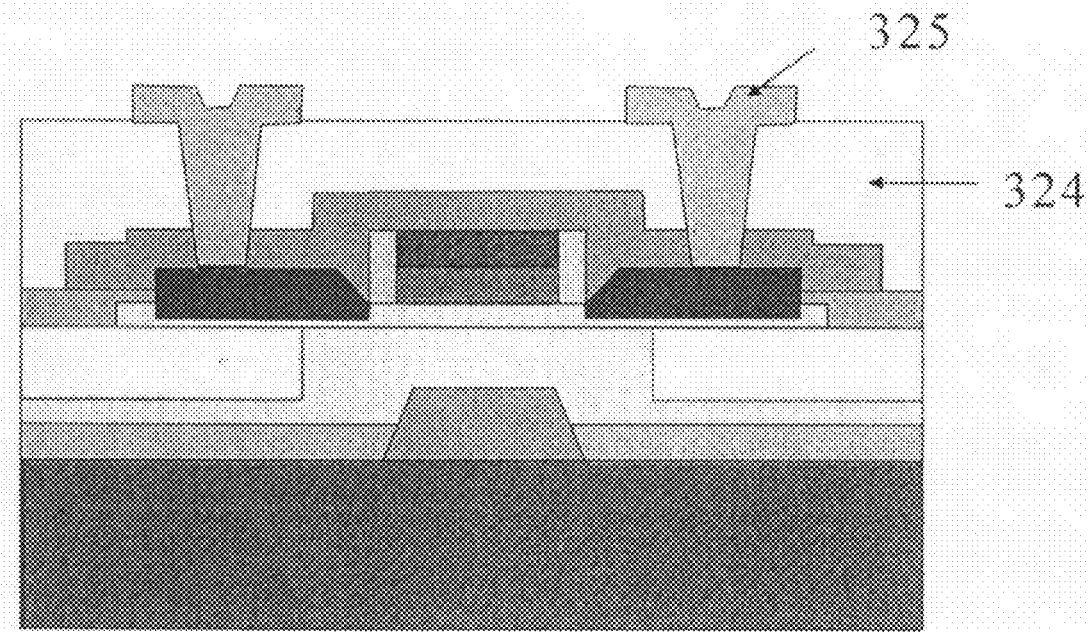

First, FIG. 5i shows an embodiment of a bipolar transistor manufactured by Shallow Trench Isolation (STI). In case of a device having 100 nm size or less due to size-reduction, electrical isolation between devices and self-alignment process are most promising way of reducing parasitic resistance and capacitance. In such a scale, the critical frequency of the device is suitably over 300 GHz.

Referring to ST1 in FIG. 4 and FIG. 5a, an insulating mask is formed on a base collector 311, and ion implantation or diffusion heat treatment is performed by using the mask to perform localization discriminating a high resistance layer 312 from a low resistance layer 313. Such localized concentration difference can attenuate kirk effects in device operation by low resistant high concentration impurities, thereby promoting high speed linear operation. For such an effect, a typical process of Selectively Implanted Collector (SIC) is used also. In this case, there is an effect of decreasing problems associated with ion implantation and process complexity. A low resistant extended collector can reduce auto-doping effect in a subsequent procedure of collector epitaxial growth.

Referring to ST2 in FIG. 4 and FIG. 5a, a collector layer 315 is epitaxially grown. In the epitaxial growth, impurities diffuse from the low resistant layer to the outside newly create an extended form. The collector layer 315 is epitaxially grown as an undoped layer with no impurities doped therein. Such an epitaxial layer is deposited in high impurity at a relatively high temperature by using Atmospheric Pressure Chemical Vapor Deposition (APCVD), Ultra High Vacuum Chemical Vapor Deposition (UHVCVD) and Low Pressure Chemical Vapor Deposition (LPCVD).

Referring to ST3 in FIG. 4 and FIG. 5c, an insulating layer 316 is formed at both side portions to isolate the device. The insulating layer 316 for isolating the device is formed by using Shallow Trench Isolation (STI) or Deep Trench Isolation (DTI). In STI and DTI, a series of process techniques such as optical photolithography, dry etching and oxide layer formation.

Referring to ST4 in FIG. 4 and FIG. 5d, a base epitaxial layer 317 is grown and then other portions except for a preset area to be used are removed by using optical photolithography and etching. The base epitaxial layer 317 utilizes a heterojunction structure composed of several types of epitaxial layers in which constitutional materials have different mole fractions and doping concentrations. It is possible to maintain excellent linearity in high speed operation by controlling the contents and topology of elements of the base epitaxial layer.

Typically, the low resistant outer base is formed by performing high concentration ion implantation into the outer base epitaxial layer and then heat treatment. However, since the invention dopes high concentration impurities in situ into the stress-inducing epitaxial layer 322, such ion implantation or heat treatment is not required. The flat base-collector interface maintains a smaller effective section than that formed via ion implantation, and thus has a small amount of base-collector capacitance. Such a base-collector interface structure can reduce parasitic resistance and parasitic capacitance thereby improving device performance.

5) Referring to ST5 in FIG. 4 and FIG. 5e, a lower emitter layer 318 and an upper emitter layer 319 are deposited, and then photolithography and etching are used to produce an emitter structure. The lower emitter layer utilizes a high concentration polycrystalline thin film or a heterojunction structure composed of a low concentration epitaxial layer and a high concentration epitaxial layer. In particular, the combined structure of low and high concentration layers are used as measures to enhance carrier implantation efficiency while maintaining Emitter-Base (EB) breakdown voltage high.

6) Referring to ST6 in FIG. 4 and FIG. 5f, a field insulating layer 321 is deposited and photolithography and dry etching are taken to produce a sidewall 320. The insulating layer sidewall 320 adjusts the emitter-to-base interval while acting as a mask for selectively growing a stress-inducing epitaxial layer 322 in the subsequent procedure. To form the insulating layer sidewall, dry etching is performed successively after the deposition of the insulating layer. The thickness of the sidewall is easily adjusted to the order of several millimeters by the thickness of the deposited insulating layer.

7) Referring to ST7 in FIG. 4 and FIG. 5g, a stress-inducing epitaxial layer 322 is formed by SEG. The stress-inducing epitaxial layer 322 is doped with a high concentration of p-type or n-type impurities the same as in the base to greatly decrease specific resistance. Like this, the stress-inducing layer acts to transfer stress while minimizing extrinsic base resistance owing to low specific resistance. Since the maximum oscillation frequency of the device generally depends on extrinsic base resistance, this procedure is very important to enhance device performance.

SEG allows selective growth on semiconductor surface by using a precursor of mixed gas containing Cl group. The SEG temperature, mixing conditions of gases and process pressure determine the epitaxial sectional structure, and thus the geometry for inducing stress can be adjusted to have a slanted (311) slope at edges as shown in FIG. 5g. For localized inducing of stress by SEG, the crystalline plane in (311) orientation develops from a region in contact with the sidewall to collect stress. Then, SEG is continued while mole fraction differences are being increased gradually to produce a structure with stress gradually collected.

The stress-inducing epitaxial layer 322 formed by SEG as above decreases composition ratio difference at the interface with the intrinsic base to prevent defects and gradually increases the composition ratio difference induce stress collection to induce stress collection by lattice constant mismatch.

8) Referring to ST8 in FIG. 4 and FIG. 5h, a stress-inducing insulating layer 323 is deposited and photolithography and dry etching are used to define the stress-inducing insulating layer 323. Examples of the stress-inducing insulating layer may include a Si-oxide layer, a Si-nitride layer and so on. By utilizing deposition technology such as LPCVD, PECVD and APCVD, an NPN bipolar device is grown to a structure capable of transferring compressive stress. For a PNP bipolar device, stress is controlled to transfer tensile stress.

9) Referring to ST9 in FIG. 4 and FIG. 5i, an insulating layer 324 is deposited and then metal lines 325 are formed. The insulating layer is deposited as a thin film to which minimum amount of stress is applied so as not to affect the stress-inducing insulating layer 323. In order to prevent a problem of stress relaxation caused by heat treatment in the stress-induced structure, the heat treatment is controlled in such a fashion that its temperature does not exceed epitaxial growth temperature.

Second Embodiment

The second embodiment will be described with reference to FIGS. 6 and 7a to 7u.

First, FIGS. 7a to 7u show a manufacturing method capable of enhancing device performance, which induces stress to an HBT by utilizing device isolation owing to LOCOS that is most typical in a case where a Si semiconductor substrate is used. While the first and second embodiments are similar as shown in the drawings, the second embodiment is more suitable for low cost mass production.

21) Referring to ST21 in FIG. 6 and FIG. 7a, a high resistance layer and a low resistance extension or layer 413 are formed sequentially on a base collector 411. Then, a collector epitaxial layer 414 is grown thereon. The low resistant extended collector 413 has an effect similar to typical SIC as described hereinbefore, and acts to collect current thereby decreasing kirk effects.

Figure 7B:
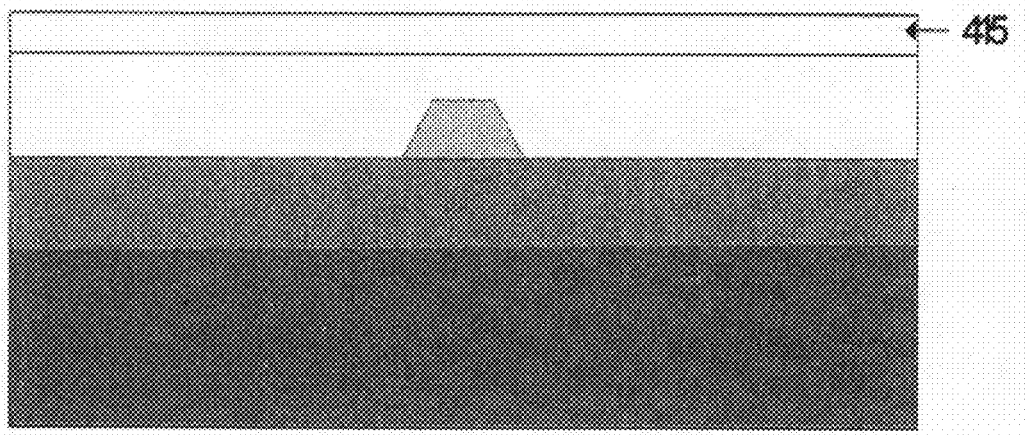

22) Referring to ST22 in FIG. 6 and FIG. 7b, an insulating layer 415 is deposited to protect semiconductor surface. In case of a Si semiconductor, a Si oxide layer is generally used as the insulating layer because it is most stable.

Figure 7C:
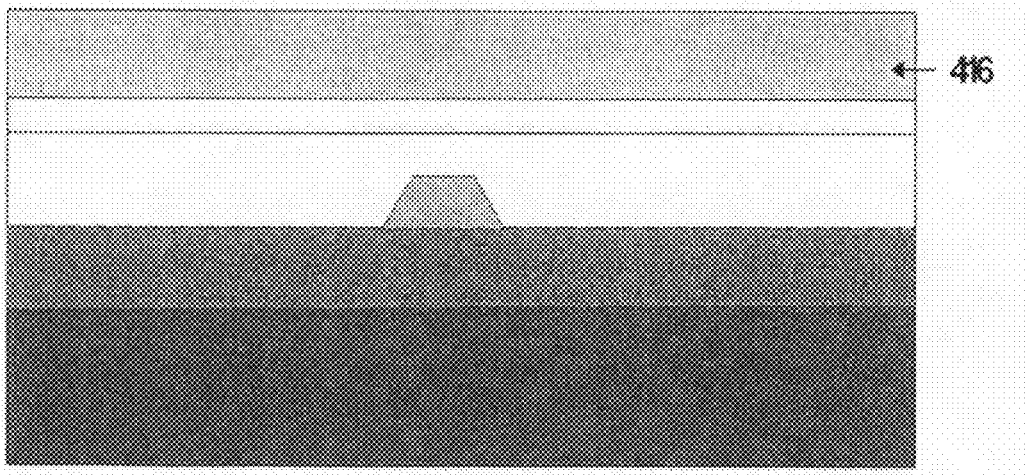

23) Referring to ST23 in FIG. 6 and FIG. 7c, a dense insulating layer 416 is deposited and used as a mask for growing a field insulating layer 417. The dense insulating layer 416 is formed by generally depositing Si nitride.

Figure 7D:
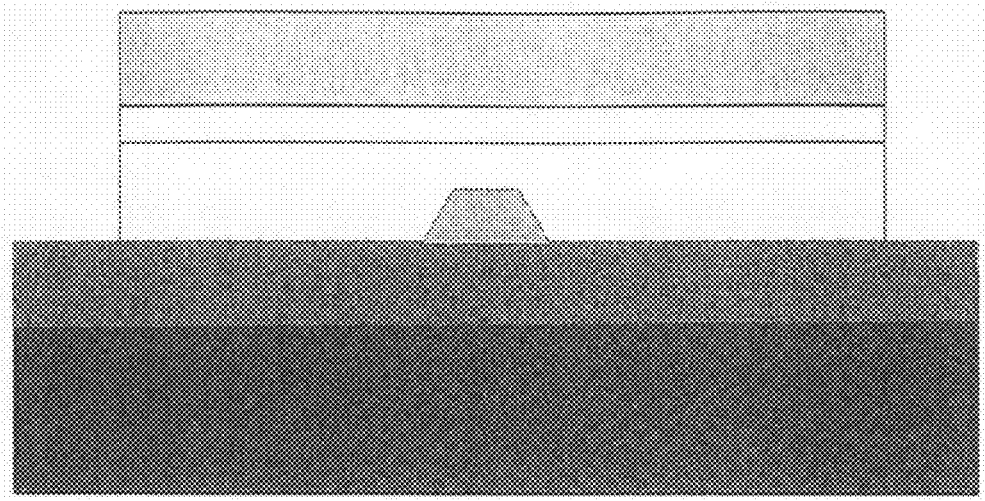

24) Referring to ST24 in FIG. 6 and FIG. 7d, photolithography and dry etching are used to etch other portions except for a preset device area. This is used to leave the semiconductor area discriminated by the collector while electrically isolating the other portions.

Figure 7E:
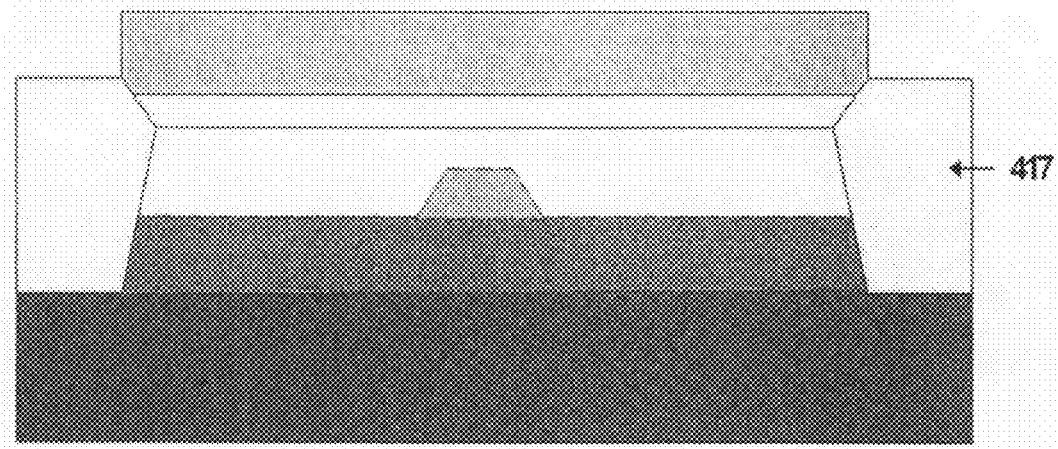

25) Referring to ST25 in FIG. 6 and FIG. 7e, heat treatment is performed sufficiently at a high temperature to grow the field insulating layer. Examples of the field insulating layer may include a thermal oxide layer or LPCVD insulating layer according to substrate types and process conditions.

Figure 7F:
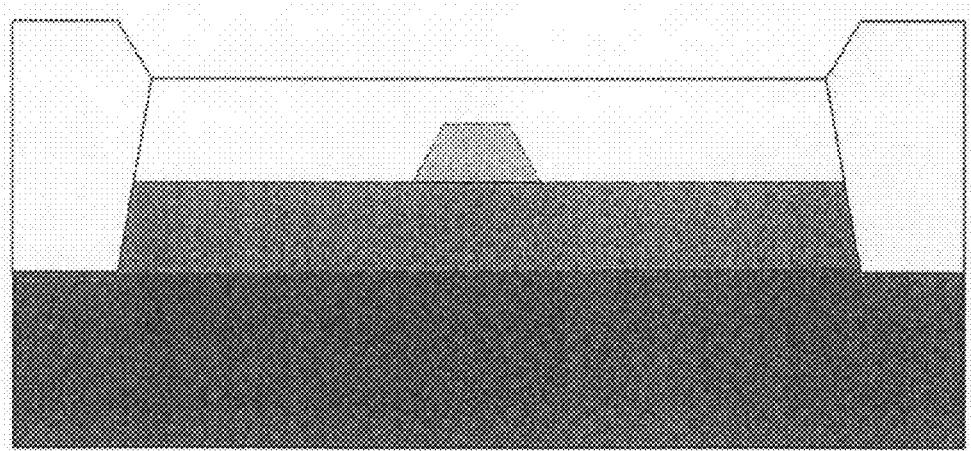

26) Referring to ST26 in FIG. 6 and FIG. 7f, wet etching is performed using a HF solution to remove the insulating layer.

Figure 7G:
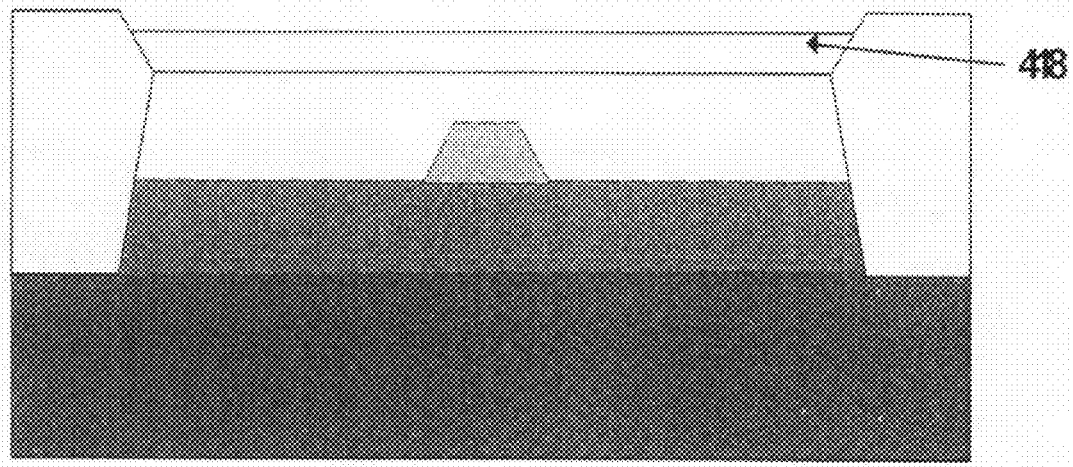

27) Referring to ST27 in FIG. 6 and FIG. 7g, an insulating layer 418 is formed again to protect semiconductor surface.

Figure 7H:
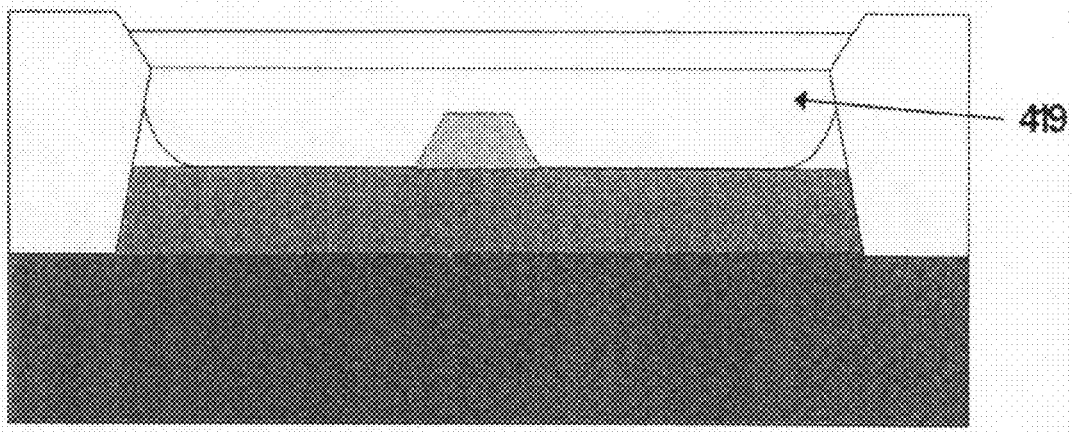

28) Referring to ST28 in FIG. 6 and FIG. 7h, suitable impurities are ion-implanted according to NPN or PNP bipolar devices and then heat treatment is performed to form a collector layer 419. The collector layer has an impurity concentration typically in the range from $10^{16}$ to $10^{18}$ cm$^{-3}$.

Figure 7I:
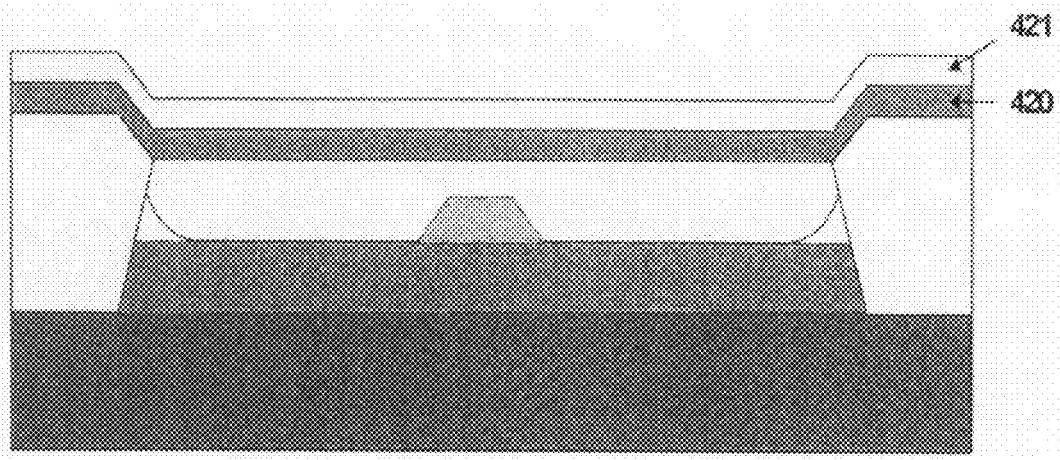

29) Referring to ST29 in FIG. 6 and FIG. 7i, a base layer 420 is epitaxially grown and then an insulating layer 421 is deposited thereon. The base layer 420 is composed of a plurality of epitaxial layers.

Figure 7J:
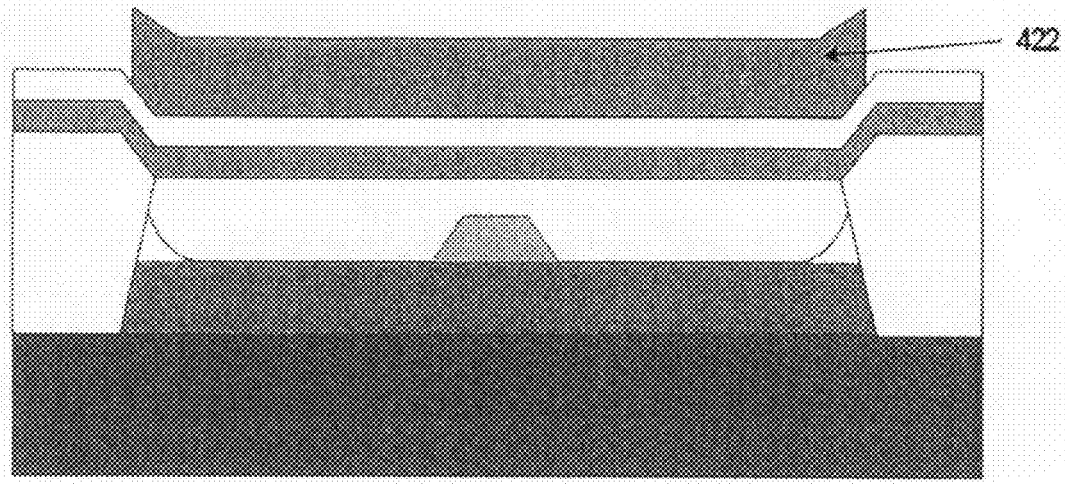

30) Referring to ST30 in FIG. 6 and FIG. 7j, a photosensitive layer 422 is applied and optical photolithography is performed to define a base area composed of an intrinsic base layer and an extrinsic base layer.

Figure 7K:
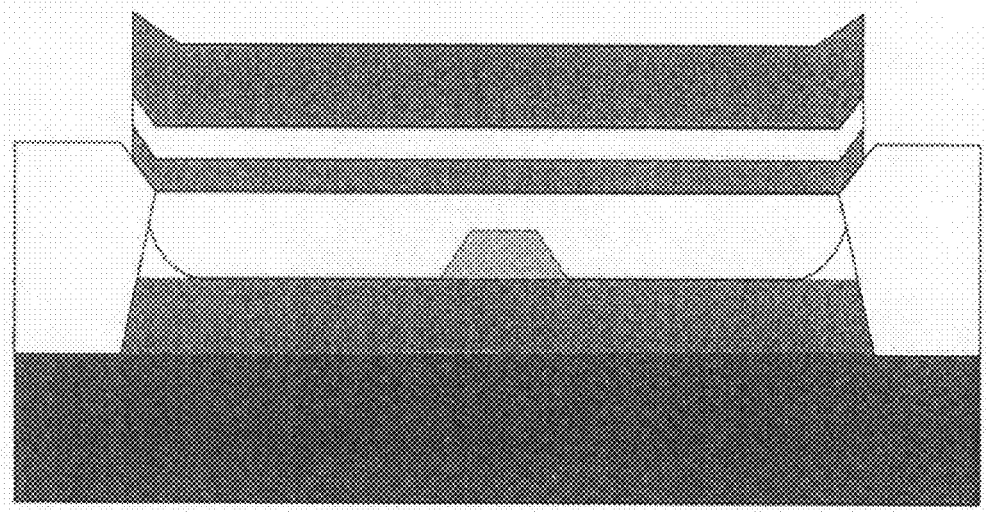

31) Referring to ST31 in FIG. 6 and FIG. 7k, the insulating layer and the base epitaxial layer are dry etched in the order.

Figure 7L:
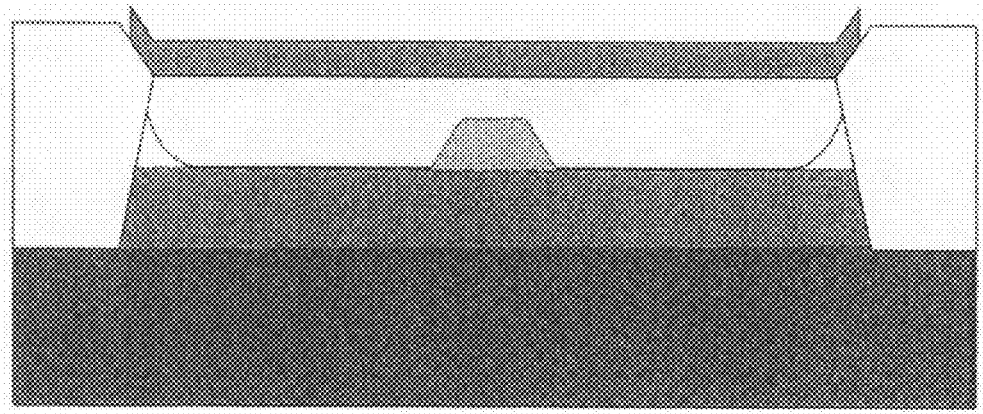

32) Referring to ST32 in FIG. 6 and FIG. 7l, the insulating layer is removed by wet etching.

Figure 7M:
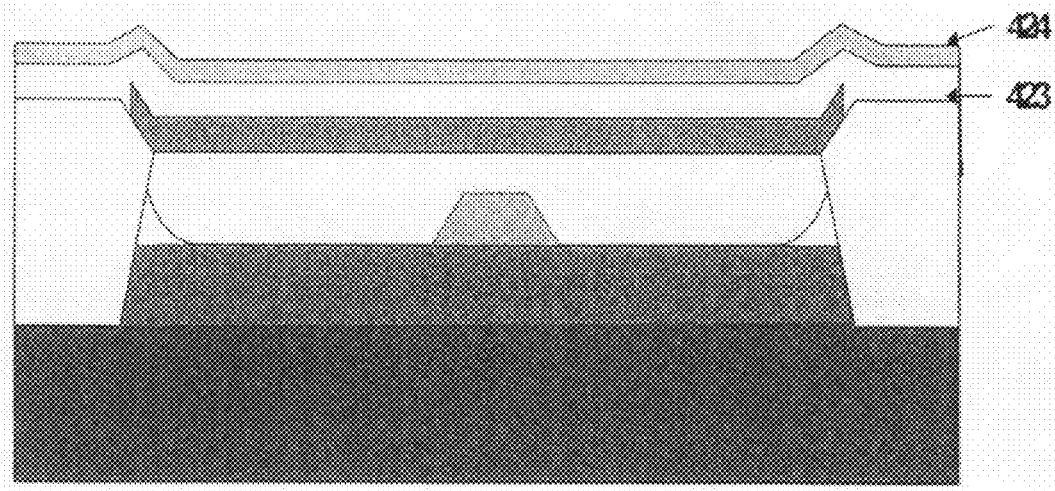

33) Referring to ST33 in FIG. 6 and FIG. 7m, an insulating layer 423 and a dense insulating layer 424 are deposited. At least two types of insulating layers are used to prevent any defects from being formed in the semiconductor structure by etching.

Figure 7N:
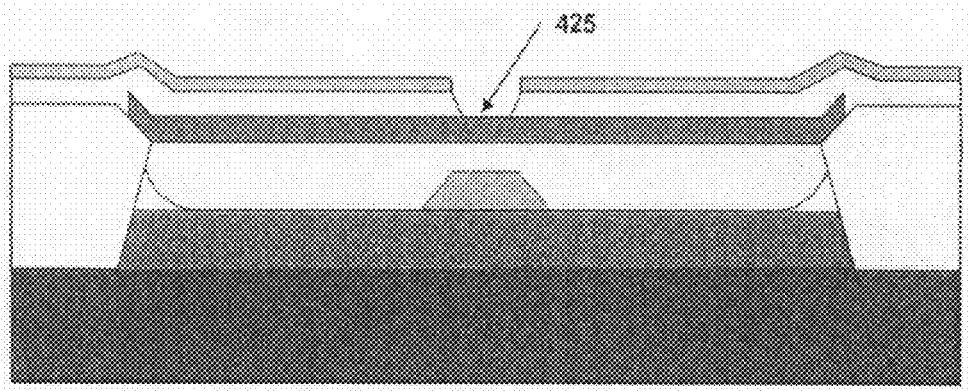

34) Referring to ST34 in FIG. 6 and FIG. 7n, an emitter contact window 425 is formed by using optical photolithography and etching. The dense insulating layer is dry etched and the underlying insulating layer is wet etched to minimize any defects on the semiconductor structure caused by the etchings.

Figure 7O:
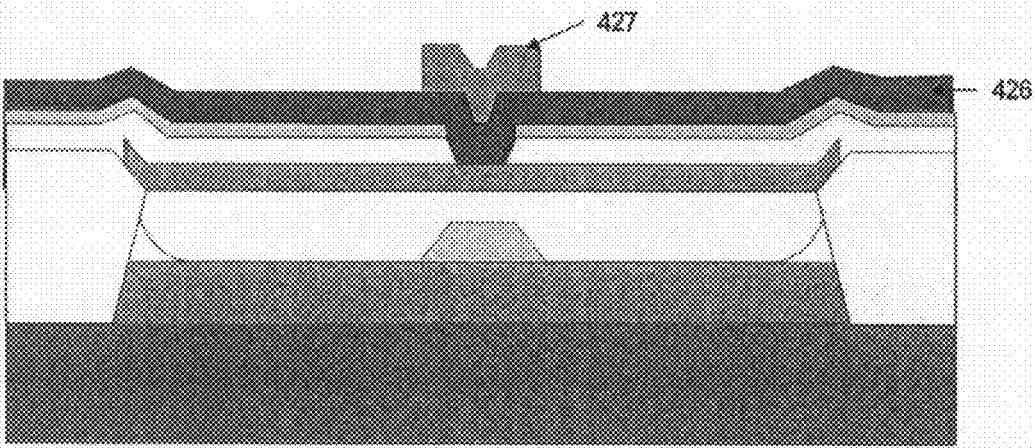

35) Referring to ST35 in FIG. 6 and FIG. 7o, a lower emitter layer 426 and an upper emitter layer 427 are deposited and then photolithography and dry etching are performed to define the upper emitter layer 427. A polycrystalline layer doped in situ or a multilayer epitaxial layer doped in various concentrations is used. The profile of the doping concentrations is used as a process parameter for adjusting breakdown voltage of EOB junction or carrier implantation efficiency.

Figure 7P:
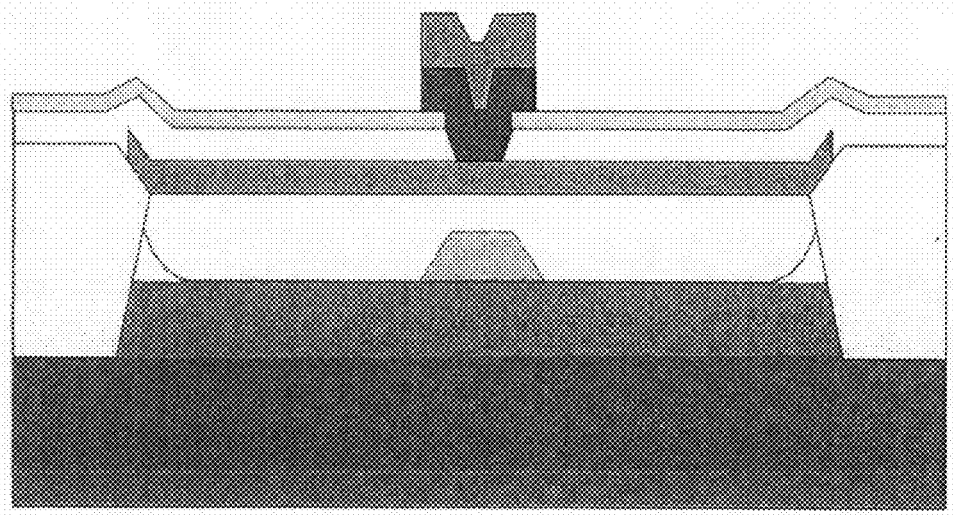

36) Referring to ST36 in FIG. 6 and FIG. 7p, the lower emitter layer 426 is defined by etching in subsequent to the upper emitter layer 427.

Figure 7Q:
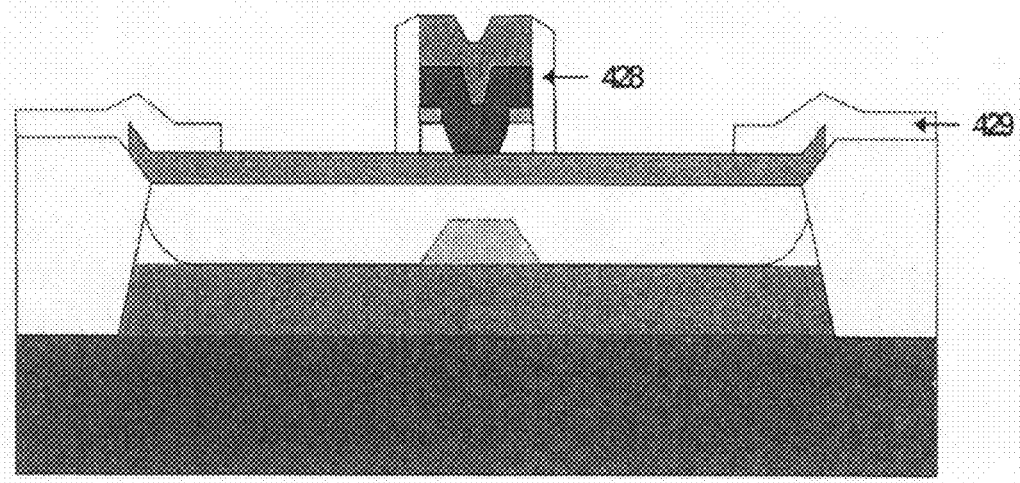

37) Referring to ST37 in FIG. 6 and FIG. 7q, an insulating layer is deposited and then optical photolithography and etching are used to form an insulating layer sidewall and leave a field insulating layer 429.

Figure 7R:
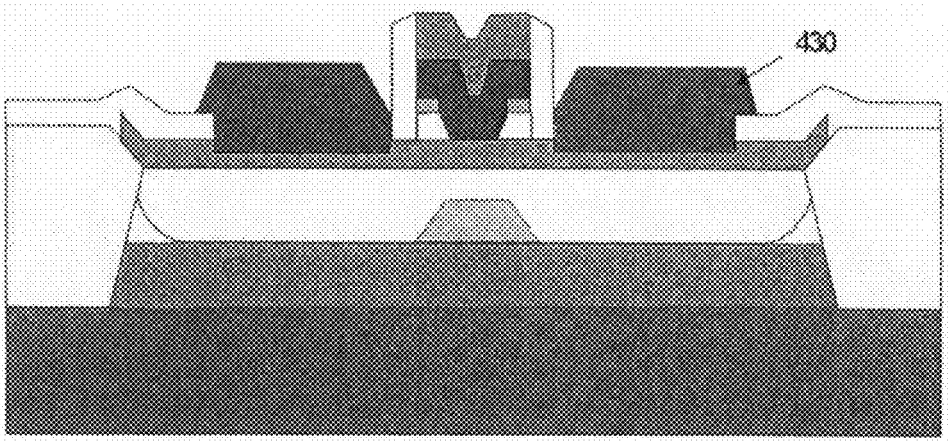

38) Referring to ST38 in FIG. 6 and FIG. 7r, a stress-inducing epitaxial layer 430 is grown. The stress-inducing epitaxial layer 430 is grown to a structure having a (311) slope, shaped to collect stress. The stress-inducing epitaxial layer is doped with high concentration impurities the same as in the base. As stated hereinbefore, high concentration doping reduces specific resistance, thereby decreasing the overall resistance of the base.

Figure 7S:
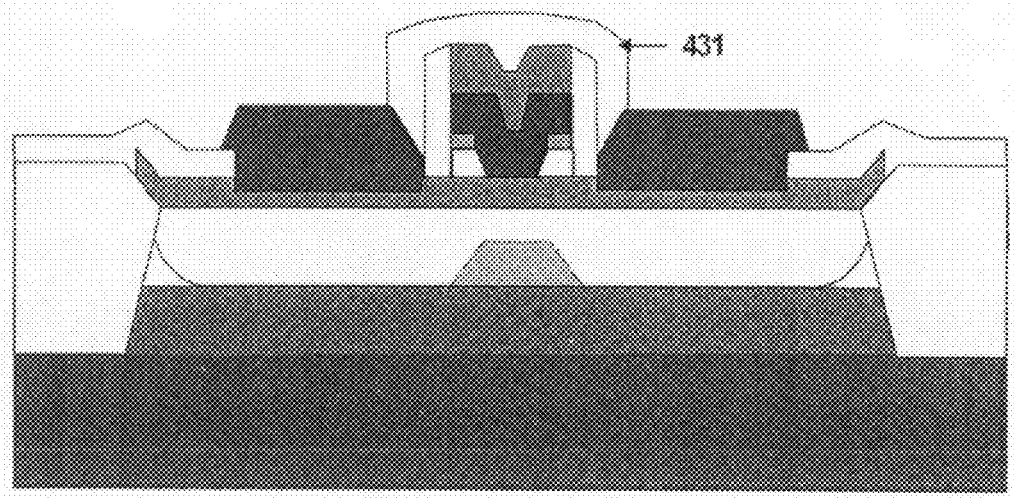

39) Referring to ST39 in FIG. 6 and FIG. 7*s*, an insulating layer 431 is deposited, and optical photolithography and etching are performed to define the insulating layer. The stress-inducing epitaxial layer is shaped into a slanted geometry by the control of process variables such as SEG temperature so that the maximum amount of stress is collectively transferred to the intrinsic base. A (311) crystalline plane develops from a region in contact with the sidewall to collect stress.

Figure 7T:
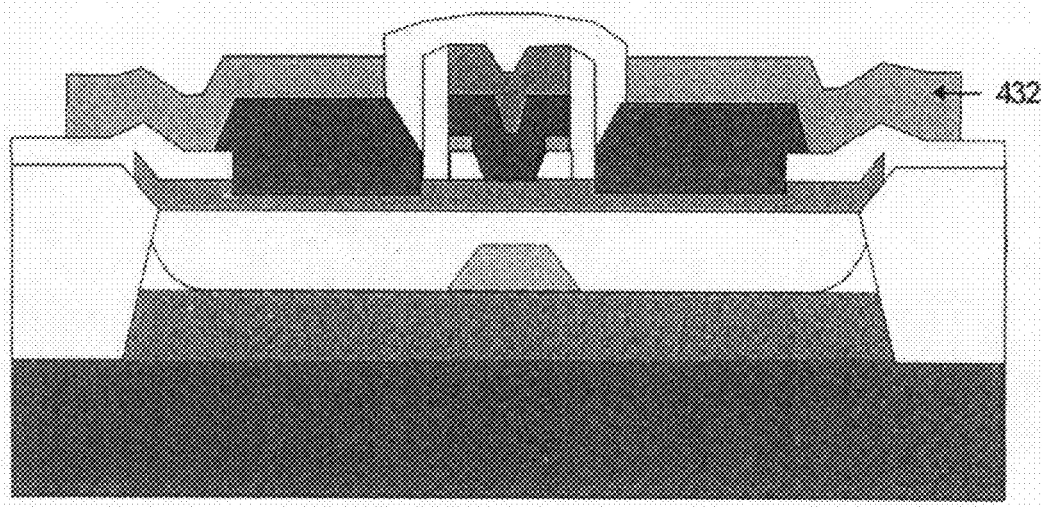

40) Referring to ST40 in FIG. 6 and FIG. 7*t*, a stress-inducing insulating layer 422 is deposited, and then optical photolithography and etching are performed to define the insulating layer. The internal stress and thickness of the stress-inducing epitaxial layer determines the amount of stress that the stress-inducing epitaxial layer transfers. Relaxation may take place in the epitaxial layer and the insulating layer configured to induce stress if thermal stress is additionally induced owing to temperature growth. Accordingly, the temperature necessary for epitaxial growth is set not to exceed 700° C., which is a typical epitaxial temperature. After that, the procedure is also carried out in conditions where the temperature of the semiconductor substrate is lower than the temperature of the epitaxial growth.

41) Referring to ST41 in FIG. 6 and FIG. 7*u*, an insulating layer 433 is deposited and metal lines 434 are formed.

Accordingly, the invention additionally induce compressive or tensile stress from outside to modify physical and electric properties of the semiconductor layer thereby improving the performance of the transistor.

As set forth above, the present invention provide the transistor structure and the manufacturing method thereof, in which compressive or tensile stress is additionally induced from outside to modify physical and electric properties of the semiconductor layer, thereby improving the performance of the transistor.

Since the conventional approaches are restricted owing to basic properties of materials, the object of the invention is to provide an advanced transistor structure in which compressive or tensile stress is additionally induced from outside to modify electric properties of materials thereby enhancing gains. In particular, as transistor size is reduced to nano-scale, transistor manufacturing processes are getting more difficult and more expensive. Therefore, the invention is especially useful to compensate difficulties in miniaturization processes.

While the present invention has been described with reference to the particular illustrative embodiments and the accompanying drawings, it is not to be limited thereto. Accordingly, the foregoing embodiments can be suitably modified and altered, and such applications fall within the scope and spirit of the present invention that shall be defined by the appended claims.

What is claimed is:

1. A heterojunction bipolar transistor structure comprising:
an emitter;
an intrinsic base;
a collector;
an insulating sidewall;
a stress-inducing base formed by selective epitaxial growth to locally induce a stress to the transistor structure wherein the stress-inducing base is formed by self-alignment epitaxial growth having a slope; and
an insulating layer for additionally inducing a local stress to the transistor structure.

2. The heterojunction bipolar transistor structure according to claim 1 wherein the stress induced by stress collection by the slope helps conduction from the emitter over the intrinsic base to the collector.

3. The heterojunction bipolar transistor structure according to claim 1 further comprising:
a low resistance extended collector defined between the collector and the intrinsic base.

4. The heterojunction bipolar transistor structure according to claim 1 further comprising:
a substrate made of one selected from IV-IV, III-V and II-VI semiconductors containing Si, GaAs, GaN and InP wherein the heterojunction bipolar transistor structure uses a heterojunction semiconductor epitaxial layer containing at least one selected from the group consisting of SiGe/Si, GaAs/AlGaAs, InP/InGaAs and GaN/AlGaN according to substrate types used, for the purpose of inducing stress.

\* \* \* \* \*